United States Patent
Kim et al.

(10) Patent No.: US 8,421,545 B2
(45) Date of Patent: Apr. 16, 2013

(54) OSCILLATORS AND METHODS OF OPERATING THE SAME

(75) Inventors: Kwang-seok Kim, Seongnam-si (KR); Sung-chul Lee, Osan-si (KR); Kee-won Kim, Suwon-si (KR); Sun-ae Seo, Hwaseong-si (KR); Ung-hwan Pi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/099,684

(22) Filed: May 3, 2011

(65) Prior Publication Data

US 2012/0038430 A1    Feb. 16, 2012

(30) Foreign Application Priority Data

Aug. 13, 2010   (KR) .................. 10-2010-0078483

(51) Int. Cl.
*H03L 7/26*   (2006.01)
*H03B 28/00*   (2006.01)
*H01L 29/82*   (2006.01)

(52) U.S. Cl.
USPC ............... 331/96; 331/3; 331/94.1; 331/154; 331/187; 257/421; 360/324.1; 360/324.11; 360/324.12; 365/158

(58) Field of Classification Search .......... 331/108 C, 331/154, 3, 94.1, 96, 187; 257/421; 360/324.1, 360/324.11, 324.12, 324.2; 365/158, 171, 365/173
See application file for complete search history.

(56) References Cited

U.S. PATENT DOCUMENTS

| | | | |
|---|---|---|---|
| 6,560,077 B2 | 5/2003 | Fujiwara et al. | |
| 7,054,119 B2 | 5/2006 | Sharma et al. | |
| 7,057,921 B2 | 6/2006 | Valet | |
| 7,088,609 B2 | 8/2006 | Valet | |
| 7,161,829 B2 | 1/2007 | Huai et al. | |
| 7,440,314 B2 * | 10/2008 | Sakimura et al. | 365/158 |
| 7,504,898 B2 | 3/2009 | Fukuzawa et al. | |
| 7,589,600 B2 | 9/2009 | Dimitrov et al. | |
| 7,610,674 B2 | 11/2009 | Zhang et al. | |
| 7,616,412 B2 * | 11/2009 | Zhu et al. | 360/324.2 |
| 7,732,881 B2 | 6/2010 | Wang | |
| 7,764,538 B2 | 7/2010 | Ito | |

(Continued)

FOREIGN PATENT DOCUMENTS

| | | |
|---|---|---|
| JP | 2006-319259 | 11/2006 |
| JP | 2007-305629 | 11/2007 |

(Continued)

OTHER PUBLICATIONS

Yoshida, et al.; "Unipolar resistive switching in CoFeB/MgO/CoFeB magnetic tunnel junction," *Applied Physics Letters*, vol. 92, pp. 113508-1-113508-3 (2008).

(Continued)

*Primary Examiner* — Levi Gannon
(74) *Attorney, Agent, or Firm* — Harness, Dickey & Pierce, P.L.C.

(57) ABSTRACT

Oscillators and methods of operating the same, the oscillators include a pinned layer having a fixed magnetization direction, a first free layer over the pinned layer, and a second free layer over the first free layer. The oscillators are configured to generate a signal using precession of a magnetic moment of at least one of the first and second free layers.

22 Claims, 6 Drawing Sheets

U.S. PATENT DOCUMENTS

| | | | |
|---|---|---|---|
| 7,965,474 | B2 | 6/2011 | Sato et al. |
| 7,994,865 | B1 | 8/2011 | Manstretta et al. |
| 2002/0054461 | A1 | 5/2002 | Fujiwara et al. |
| 2004/0257717 | A1 | 12/2004 | Sharma et al. |
| 2005/0063222 | A1 | 3/2005 | Huai et al. |
| 2005/0254286 | A1 | 11/2005 | Valet |
| 2005/0254287 | A1 | 11/2005 | Valet |
| 2006/0256484 | A1 | 11/2006 | Sato et al. |
| 2007/0047294 | A1 | 3/2007 | Panchula |
| 2007/0109147 | A1 | 5/2007 | Fukuzawa et al. |
| 2007/0188936 | A1 | 8/2007 | Zhang et al. |
| 2007/0259209 | A1 | 11/2007 | Slavin et al. |
| 2008/0019040 | A1 | 1/2008 | Zhu et al. |
| 2008/0074806 | A1 | 3/2008 | Sato et al. |
| 2008/0150640 | A1 | 6/2008 | Dimitrov et al. |
| 2008/0150643 | A1 | 6/2008 | Suzuki et al. |
| 2008/0241597 | A1 | 10/2008 | Dieny et al. |
| 2009/0050991 | A1 | 2/2009 | Nagai et al. |
| 2009/0080106 | A1 | 3/2009 | Shimizu et al. |
| 2009/0097169 | A1 | 4/2009 | Sato et al. |
| 2009/0097170 | A1 | 4/2009 | Sato et al. |
| 2009/0168501 | A1 | 7/2009 | Ito |
| 2009/0201614 | A1 | 8/2009 | Kudo et al. |
| 2009/0244792 | A1 | 10/2009 | Nakayama et al. |
| 2009/0302953 | A1 | 12/2009 | Xi et al. |
| 2009/0303779 | A1 | 12/2009 | Chen et al. |
| 2010/0039105 | A1 | 2/2010 | Ryan et al. |
| 2010/0039181 | A1 | 2/2010 | Firastrau et al. |
| 2010/0103730 | A1 | 4/2010 | Shin |
| 2010/0308923 | A1 | 12/2010 | Kaka |
| 2011/0260270 | A1 * | 10/2011 | Zhang et al. .................. 257/421 |
| 2011/0280340 | A1 | 11/2011 | Pasanen et al. |
| 2012/0038428 | A1 | 2/2012 | Lee et al. |

FOREIGN PATENT DOCUMENTS

| | | |
|---|---|---|
| JP | 2008-053915 | 3/2008 |
| JP | 2008-084879 | 4/2008 |
| JP | 2009-094226 | 4/2009 |
| JP | 2009-099741 | 5/2009 |
| JP | 2009-135471 | 6/2009 |
| JP | 2009-277704 | 11/2009 |
| KR | 2004-0055384 | 6/2004 |
| KR | 10-0697779 | 3/2007 |
| KR | 10-0827497 | 5/2008 |
| KR | 10-0866973 | 11/2008 |
| KR | 2009-0011247 | 2/2009 |
| KR | 2009-0031819 | 3/2009 |
| KR | 2009-0044575 | 5/2009 |
| KR | 2009-0071404 | 7/2009 |
| KR | 2009-0087825 | 8/2009 |
| KR | 2009-0102676 | 9/2009 |
| KR | 2009-0119253 | 11/2009 |

OTHER PUBLICATIONS

Houssameddine, et al.; "Spin transfer induced coherent microwave emission with large power from nanoscale MgO tunnel junctions," *Applied Physics Letters*, vol. 93, pp. 022505-1-022505-3 (2008).

Dimitrov, et al.; "Dielectric breakdown of MgO magnetic tunnel junctions," *Applied Physics Letters*, vol. 94, pp. 123110-1-113110-3 (Mar. 26, 2009).

Kiselev, et al.; "Microwave oscillations of a nanomagnet driven by a spin-polarized current," *Nature*, vol. 425, pp. 380-383 (Sep. 25, 2003).

Kaka, et al., "Mutual phase-locking of microwave spin torque nano-oscillators," *Nature*, vol. 427, pp. 389-392 (Sep. 15, 2005).

Deac, et al., "Bias-driven high-power microwave emission from MgO-based tunnel magnetoresistance devices," *Nature Physics*, vol. 4, pp. 803-809 (Aug. 10, 2008).

Georges, et al., "Origin of the spectral linewidth in nonlinear spin-transfer oscillators based on MgO tunnel junctions," *Physical Review*, vol. 80, pp. 060404-1-060404-4 (Aug. 31, 2009).

Rippard, et al., "Direct-Current Induced Dynamics in $Co_{90}Fe_{10}/Ni_{80}Fe_{20}$ Point Contacts," *Physical Review Letters*, vol. 92, No. 2, pp. 027201-1-027201-4 (Jan. 16, 2004).

Office Action for corresponding U.S. Appl. No. 12/929,388 dated Mar. 28, 2012.

Office Action for corresponding U.S. Appl. No. 12/929,932 dated Apr. 24, 2012.

Office Action dated Oct. 16, 2012 issued in related U.S. Appl. No. 13/064,627.

Office Action dated Jan. 10, 2013 issued in U.S. Appl. No. 13/174,932.

* cited by examiner

OSCILLATORS AND METHODS OF OPERATING THE SAME

CROSS-REFERENCE TO RELATED APPLICATIONS

This application claims priority under 35 U.S.C. §119 from Korean Patent Application No. 10-2010-0078483, filed on Aug. 13, 2010, in the Korean Intellectual Property Office, the disclosure of which is incorporated herein in its entirety by reference.

BACKGROUND

1. Field

Example embodiments relate to oscillators and methods of operating the same.

2. Description of the Related Art

Oscillators are devices that generate signals having given frequencies. Oscillators are used in a wireless communication system (e.g., a mobile phone, a satellite and radar communication device, a wireless network device, an automobile communication device), and in an analog sound synthesizer.

Main factors of an oscillator are a quality factor, an output power, and/or phase noise. As the quality factor and the output power of the oscillator increases and the phase noise of the oscillator decreases, the characteristics of the oscillator are improved. Recently, as the demand for high performance and the miniaturization of communication devices increases and the operating frequency bands of communication devices are increased, it is required to develop a high-output oscillator having a small size, a high quality factor and low phase noise.

Spin torque oscillators using a spin transfer torque phenomenon have been suggested. Spin torque oscillators can be manufactured to be much smaller than general inductor and capacitor (LC) oscillators and general film bulk acoustic resonator (FBAR) oscillators and have a relatively high quality factor and thus have drawn attention as the next generation of oscillators.

However, general spin torque oscillators require a strong magnetic field for high-frequency oscillation. For example, in order to generate the frequency of about several GHz, an external magnetic field of about several hundreds of oersted (Oe) should be applied to general spin torque oscillators. However, it is very difficult to apply such a large external magnetic field to general spin torque oscillators. Also, an additional device for applying an external magnetic field disturbs miniaturization, an advantage of spin torque oscillators.

SUMMARY

Example embodiments relate to oscillators and methods of operating the same.

Provided are oscillators that use a spin transfer torque phenomenon and are capable of generating a high frequency signal without applying an external magnetic field thereto. Provided are methods of operating an oscillator.

Additional aspects will be set forth in part in the description which follows and, in part, will be apparent from the description, or may be learned by practice of the presented embodiments.

According to example embodiments, an oscillator includes a first pinned layer having a fixed magnetization direction, a first free layer over the first pinned layer, and a second free layer over the first free layer. The oscillator is configured to generate a signal using precession of a magnetic moment of at least one of the first and second free layers.

The first pinned layer and the first and second free layers may have in-plane magnetic anisotropy. The first pinned layer and the first and second free layers may have perpendicular magnetic anisotropy.

The oscillator may further include a first separation layer between the first pinned layer and the first free layer, and a second separation layer between the first free layer and the second free layer. The first and second separation layers may be an insulating layer or a conductive layer.

The oscillator may further include at least one additional free layer disposed above the second free layer, and at least one additional separation layer disposed between the free layers.

The oscillator may further include a synthetic antiferromagnet (SAF) structure. The synthetic antiferromagnet (SAF) structure may include the first pinned layer. In this case, the SAF structure may further include a second pinned layer, wherein the first pinned layer is disposed between the second pinned layer and the first free layer, and a spacer disposed between the first pinned layer and the second pinned layer.

The oscillator may further include an antiferromagnetic layer disposed on a surface of the first pinned layer. In this case, the first pinned layer may be disposed between the antiferromagnetic layer and the first free layer.

The oscillator may be a magnetic field-free oscillator.

The first pinned layer may be configured to apply a first spin torque to the first free layer, the second free layer may be configured to apply a second spin torque or a first stray field to the first free layer, and the second spin torque and the first stray field may have a direction opposite to that of the first spin torque.

According to example embodiments, a method of operating an oscillator includes applying a current to the oscillator so that a magnetic moment of at least one of a first free layer and a second free layer is precessed, and detecting a change in a resistance of the oscillator when the magnetic moment of the at least one of the first and second free layers is precessed.

The method may further include applying a current to the oscillator so that electrons flow from a first pinned layer to the first and second free layers.

The first pinned layer and the first and second free layers may have in-plane magnetic anisotropy. The first pinned layer and the first and second free layers may have perpendicular magnetic anisotropy.

A first separation layer may be disposed between the first pinned layer and the first free layer, a second separation layer may be disposed between the first free layer and the second free layer. The first and second separation layers may be an insulating layer or a conductive layer.

At least one additional separation layer and at least one additional free layer may be alternately disposed on the second free layer.

A synthetic antiferromagnet (SAF) structure may be further provided. The synthetic antiferromagnet (SAF) structure may include the first pinned layer.

An antiferromagnetic layer may be disposed on a lower surface of the first pinned layer.

The method may further includes applying a first spin torque to the first free layer, and providing a second spin torque or a first stray field to the first free layer. The second spin torque and the first stray field may have a direction opposite to that of the first spin torque.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
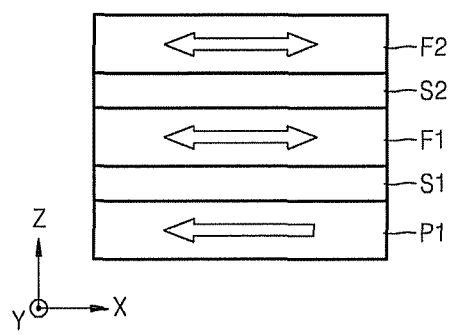
FIGS. 1 through 3 are cross-sectional views of oscillators according to example embodiments.

Various example embodiments will now be described more fully with reference to the accompanying drawings in which example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Example embodiments relate to oscillators and methods of operating the same.

FIG. 1 is a cross-sectional view of an oscillator according to example embodiments.

Referring to FIG. 1, an oscillator according to example embodiments may include a plurality of free layers, for example, first and second free layers F1 and F2, which are stacked on a pinned layer P1. A first separation layer S1 may be interposed between the pinned layer P1 and the first free layer F1, and a second separation layer S2 may be interposed between the first free layer F1 and the second free layer F2.

The pinned layer P1 is a magnetic layer having a fixed magnetization direction and may be formed of a ferromagnetic material including at least one of cobalt (Co), iron (Fe), nickel (Ni) and combinations thereof. The ferromagnetic material may further include other elements than Co, Fe, and Ni. For example, the pinning layer P1 may include at least one of PtMn, IrMn, MnO, MnS, MnTe or MnF. There may be several methods of fixing the magnetization direction of the pinned layer P1. For example, in order to fix the magnetization direction of the pinned layer P1, a synthetic antiferromagnet (SAF) structure (not shown) or an antiferromagnetic layer (not shown) may be used. This will be described later in more detail. Alternatively, the magnetization direction of the pinned layer P1 may be fixed by increasing the thickness of the pinned layer P1 without using the SAF structure or the antiferromagnetic layer. That is, the magnetization direction of the pinned layer P1 may be fixed by adjusting the thickness of the pinned layer P1 without using an additional layer.

The first and second free layers F1 and F2 have variable magnetization directions and may be formed of ferromagnetic materials. The ferromagnetic materials may include at least one of Co, Fe, and Ni and may also further include other elements (e.g., boron (B), chromium (Cr), platinum (Pt), palladium (Pd), and the like) than Co, Fe, and Ni. For example, the first and second free layers F1 and F2 may include at least one of CoFeB, CoFe, NiFe, CoFePt, CoFePd, CoFeCr, CoFeTb, CoFeGd or CoFeNi. Thicknesses of the first and second free layers F1 and F2 may be about 0.5 nm to about 10 nm (e.g., about 1 nm to about 5 nm). The thicknesses of the first and second free layers F1 and F2 may be the same, or different.

The pinned layer P1 and the first and second free layers F1 and F2 may have in-plane magnetic anisotropy or perpendicular magnetic anisotropy. In FIG. 1, the pinned layer P1 and the first and second free layers F1 and F2 have in-plane magnetic anisotropy, and the magnetization direction of the pinned layer P1 is fixed in a reverse X-axis direction, and the first and second free layers F1 and F2 have magnetization easy axes that are perpendicular the X-axis. This is just an example. The magnetization direction of the pinned layer P1 and directions of the magnetization easy axes of the first and second free layers F1 and F2 may be changed in various ways.

The first and second separation layers S1 and S2 may be insulating layers or conductive layers. The insulating layers may include a magnesium (Mg) oxide or an aluminium (Al) oxide, for example. The conductive layers may include at least one metal selected from the group consisting of copper (Cu), aluminium (Al), gold (Au), silver (Ag), and any mixtures thereof. Thicknesses of the first and second separation layers S1 and S2 may be about 0.5 nm to about 3 nm, for example. When the first and second separation layers S1 and S2 are insulating layers, the oscillator according to example embodiments may have a tunnel magneto resistance (TMR) structure. When the first and second separation layers S1 and S2 are conductive layers, the oscillator according to example embodiments may have a giant magneto resistance (GMR) structure. If necessary, one of the first and second separation layers S1 and S2 may be an insulating layer, and the other one thereof may be a conductive layer.

Although not shown in FIG. 1, a first electrode may be disposed on a lower surface of the pinned layer P1, and a second electrode may be disposed on an upper surface of the second free layer F2. The first electrode or the second electrode may be optionally disposed depending on the material used to form the pinned layer P1 and the second free layer F2. For example, when electrical resistances of the pinned layer P1 and the second free layer F2 are sufficiently low, the pinned layer P1 and the second free layer F2 may be used as electrodes. Thus, the first electrode and second electrode may not be disposed.

The oscillator according to example embodiments described above may generate a signal within a given frequency band by using the precession of at least one magnetic moment of the first and second free layers F1 and F2. For example, the magnetic moment of the first free layer F1 may be precessed alone, or both magnetic moments of the first and second free layers F1 and F2 may be precessed. Precession of the magnetic moment means that the axis of the magnetic moment is rotated while the axis is moving a given orbit. In this regard, an axial direction of the magnetic moment may be the same as a magnetization direction. Thus, precession of the magnetic moment may correspond to rotation of the magnetization direction. As at least one magnetic moment of the first and second free layers F1 and F2 is precessed, an electrical resistance between the pinned layer P1 and the free layers F1 and F2 may be periodically varied, and as such, a signal within a given frequency band may be generated.

Because the oscillator according to example embodiments has two free layers F1 and F2 that are adjacent to each other, the magnetic moments of the free layers F1 and F2 may be precessed by only applying a current to the oscillator without applying an external magnetic field thereto. Generally, in order to make a precession of the magnetic moment, a current-induced spin transfer torque for perturbation of the magnetic moment and an external magnetic field that provides a restoring force of the magnetic moment are required. When a force of perturbation of the magnetic moment and a restoring force are balanced, the axis of the magnetic moment may be rotated while drawing a given orbit. In a spin torque oscillator (comparative example) using a single free layer, an external magnetic field for providing the restoring force should be applied to the spin torque oscillator in order to make a precession of the magnetic moment of the single free layer. In other words, an external magnetic field for providing the restoring force to the magnetization direction of the single free layer is required. However, in example embodiments, the second free layer F2 may apply energy (force) similar to the external magnetic field to the first free layer F1, or the first free layer F1 may apply energy (force) similar to the external magnetic field to the second free layer F2. Thus, the oscillator according to example embodiments may generate a high-frequency signal by applying a current to the oscillator without requiring an external magnetic field. That is, the oscillator according to example embodiments may be a magnetic field-free oscillator. The operating principle of the oscillator according to example embodiments will be described later with reference to FIGS. 4 through 6 in more detail.

Figure 2:
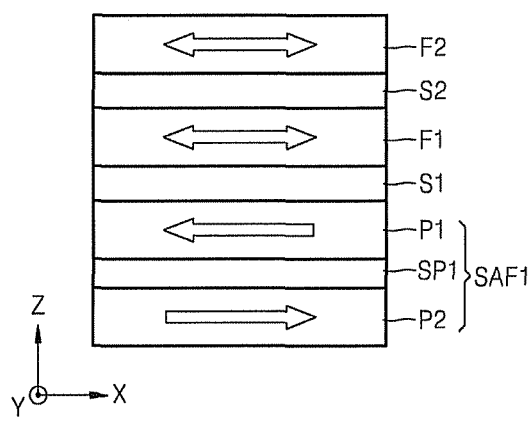
Figure 3:
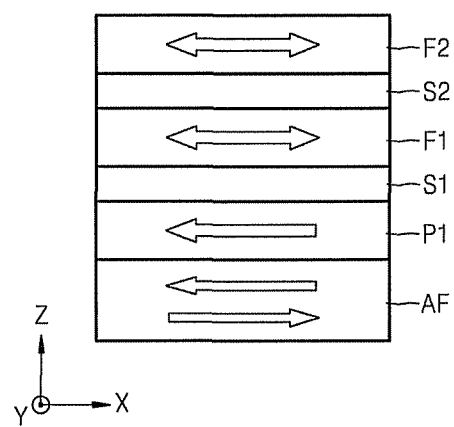

FIGS. 2 and 3 illustrate oscillators according to example embodiments. FIG. 2 illustrates a case where a pinned layer is a portion of a synthetic antiferromagnet (SAF) structure. FIG. 3 illustrates a case where an antiferromagnetic layer is disposed on a lower surface of a pinned layer. The SAF structure and the antiferromagnetic layer may be elements for fixing the magnetization direction of the pinned layer P1.

Referring to FIG. 2, a spacer SP1 and a second pinned layer P2 may be sequentially disposed on a lower surface of the pinned layer P1 (hereinafter, referred to as a first pinned layer). The first and second pinned layers P1 and P2 may have magnetization directions that are fixed to be opposite to each other. In other words, the first and second pinned layers P1 and P2 may be magnetized in opposite directions to each other. The first and second pinned layers P1 and P2 may have opposite magnetization directions due to exchange coupling characteristics between the two pinned layers P1 and P2. The exchange coupling characteristics may be exhibited when a material and a thickness of the spacer SP1 satisfy a given condition. In this case, the first pinned layer P1 and the second pinned layer P2 may, collectively, form a synthetic antiferromagnet (SAF) structure SAFI having the spacer SP1 interposed therebetween. Although not shown, an antiferromagnetic layer for fixing the magnetization direction of the second pinned layer P2 may be further disposed on a lower surface of the second pinned layer P2.

Referring to FIG. 3, an antiferromagnetic layer AF1 may be disposed on a lower surface of the pinned layer P1. The antiferromagnetic layer AF1 has characteristics in which magnetic moments of atoms are regularly arranged in a positive direction and a reverse direction. The magnetization direction of the pinned layer P1 may be fixed in the direction of the magnetic moment of an uppermost portion of the antiferromagnetic layer AF1 that is adjacent to the pinned layer P1. As illustrated in FIG. 3, when the magnetic moment of the uppermost portion of the antiferromagnetic layer AF1 is in a reverse X-axis direction, magnetization of the pinned layer P1 may be fixed in the reverse X-axis direction. The antiferromagnetic layer AF1 may include a manganese (Mn)-based material. The Mn-based material may be indium manganese (InMn), iron manganese (FeMn), and the like. However, a material used to form the antiferromagnetic layer AF1 is not limited to the Mn-based material. Any material having antiferromagnetic characteristics may be used as the material used to form the antiferromagnetic layer AF1.

Figure 4:
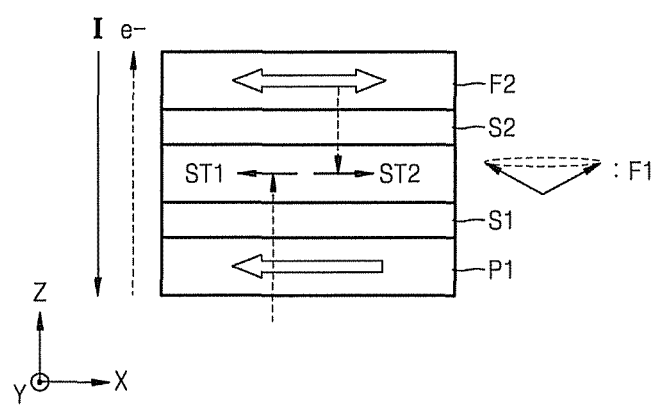
FIGS. 4 through 6 are cross-sectional views illustrating a method of operating the oscillator of FIG. 1 according to example embodiments.

FIG. 4 is a cross-sectional view illustrating a method of operating the oscillator illustrated in FIG. 1 according to example embodiments.

FIG. 4 follows a first operating principle.

Referring to FIG. 4, a magnetic moment of the first free layer F1 may be precessed by applying a current I to the oscillator. The current I may be applied from the second free layer F2 to the pinned layer P1. Due to the current I, electrons $e^-$ may flow from the pinned layer P1 to the second free layer F2 via the first free layer F1. The electrons $e^-$ that flow to the first free layer F1 via the pinned layer P1 may have the same spin direction as that of the pinned layer P1 and may apply a first spin torque ST1 in a first direction (a reverse X-axis direction) to the first free layer F1. The magnetic moment of the first free layer F1 may be perturbed due to the first spin torque ST1. Also, at least a portion of electrons $e^-$ that flow to the second free layer F2 via the first free layer F1 may be returned to the first free layer F1 from the second free layer F2. The electrons $e^-$ that are returned to the first free layer F1 from the second free layer F2 in this manner may apply a second spin torque ST2 in a second direction (an X-axis direction) to the first free layer F1. The direction of the second spin torque ST2 may be opposite to that of the first spin torque ST1. Due to the second spin torque ST2, a restoring force may be applied to the magnetic moment of the first free layer F1. Thus, when a perturbation force of the magnetic moment of the first free layer F1 due to the first spin torque ST1 and a restoring force of the magnetic moment of the first free layer F1 due to the second spin torque ST2 are balanced, the axis of the magnetic moment of the first free layer F1 may be rotated while the axis is moving along a given orbit (as schematically illustrated in FIG. 4). As the magnetic moment is precessed, an electrical resistance of the oscillator may be periodically varied, and as such, a signal within a given frequency band may be oscillated.

Figure 5:
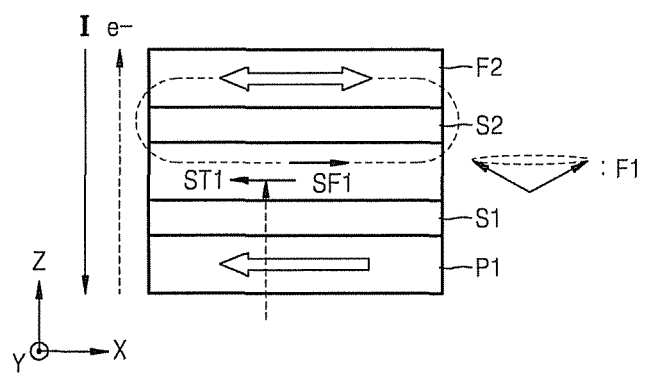

FIG. 5 is a cross-sectional view illustrating a method of operating the oscillator illustrated in FIG. 1 according to other example embodiments.

FIG. 5 follows a second operating principle.

Referring to FIG. 5, in a similar manner to FIG. 4, a magnetic moment of the first free layer F1 may be precessed by applying a current I to the oscillator. Due to a current I, electrons $e^-$ that flow to the first free layer F1 via the pinned layer P1 may have the same spin direction as that of the pinned layer P1 and may apply a first spin torque ST1 in a first direction (a reverse X-axis direction) to the first free layer F1. The magnetic moment of the first free layer F1 may be perturbed due to the first spin torque ST1. A stray field SF1 in an opposite direction to that of the first spin torque ST1 may be applied from the second free layer F2 to the first free layer F1. Due to the presence of the stray field SF1, a restoring force may be applied to the magnetic moment of the first free layer F1. Thus, when a perturbation force of the magnetic moment of the first free layer F1 due to the first spin torque ST1 and a restoring force of the magnetic moment of the first free layer F1 due to the stray field SF1 are balanced, the magnetic moment may be precessed, and as such, a signal within a given frequency band may be oscillated.

The oscillator according to example embodiments may operate using at least one of the first operating principle described with reference to FIG. 4 (i.e., a principle in which precession is induced due to the first and second spin torques ST1 and ST2 in opposite directions) and the second operating principle described with reference to FIG. 5 (i.e., a principle in which precession is induced due to the first spin torque ST1 and the stray field SF1 in opposite directions).

Figure 6:
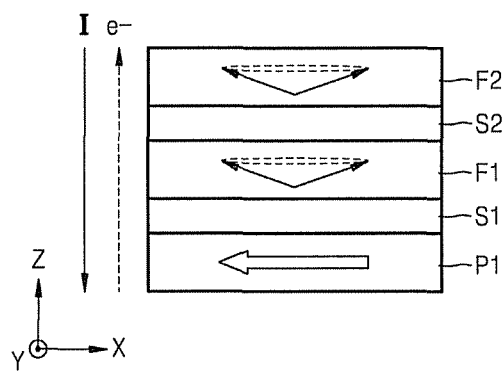

In FIGS. 4 and 5, the magnetic moment of the first free layer F1 is precessed alone. However, as illustrated in FIG. 6, the magnetic moment of the second free layer F2 may also be precessed. More specifically, a spin torque having a direction and a stray field having an opposite direction to that of the spin torque may be applied to the second free layer F2. Thus, the magnetic moment of the second free layer F2 may be precessed. The stray field applied to the second free layer F2 may be induced from the first free layer F1. As the direction of the magnetic moment of the first free layer F1 is varied, the direction of the stray field applied from the first free layer F1 to the second free layer F2 may be periodically varied. Also, the direction of the spin torque applied from the first free layer F1 to the second free layer F2 may be periodically varied. Thus, the magnetic moment of the second free layer F2 may be precessed as well. Precession of the magnetic moment of the second free layer F2 may affect precession of the first free layer F1. The magnetic moments of the first and second free layers F1 and F2 may be precessed while being affected each other.

Directions of precession of the magnetic moments illustrated in FIGS. 4 through 6 are just examples. The directions of precession of the magnetic moments may be varied according to materials used to the first and second free layers F1 and F2, thicknesses thereof, or the like.

According to example embodiments, at least two free layers F1 and F2 that are adjacent to each other are used for the oscillator that is capable of oscillating at a high-frequency signal within a given band without requiring an external magnetic field. Thus, the oscillator according to example embodiments may have a compact size, and it may be operated by a simple operation procedure.

In addition, because the oscillator according to example embodiment includes the pinned layer P1 disposed on one side of the plurality of free layers F1 and F2, a spin torque may be stably provided from the pinned layer P1 to the plurality of free layers F1 and F2. The pinned layer P1 may be an element for applying electrons having a spin in a given direction to the free layers F1 and F2. Thus, the oscillator according to example embodiments may operate more easily than a case where an oscillator does not include the pinned layer P1. The oscillator according to example embodiments may have a wide operating window. Also, the pinned layer P1 may increase an output power. When the oscillator includes the pinned layer P1, the amount of change in the resistance of the oscillator according to precession may be increased compared to a case where the oscillator does not include the pinned layer P1. The amount of change in the resistance between the pinned layer P1 and the first free layer F1 may be relatively larger than the amount of change in the resistance between the first free layer F1 and the second free layer F2. This means that an output power of the oscillator is significantly increased due to the pinned layer P1. Therefore, the pinned layer P1 of the oscillator according to example embodiments may stably induce the spin torque for oscillation, as well as, increase the output power of the oscillator.

In addition, the oscillator according to example embodiments may be a frequency tunable oscillator whose oscillation frequency is varied based on the condition of an operating current (i.e., the current I of FIGS. 4 through 6). The oscillator according to example embodiments may be operated by applying a current thereto without requiring an external magnetic field. Thus, frequency may be easily tuned compared to a case where the external magnetic field is used. In a general LC oscillator, a frequency tuning range is less than about 10%. However, a frequency tuning range of the oscillator according to example embodiments may be much wider (e.g., about several tens through about several hundreds %), because frequency is easily tuned according to a current and the window of the operating current is wide. Furthermore, an oscillation frequency of the oscillator according to example embodiments may be tuned based on other characteristics of the layers included in the oscillator (e.g. thickness, material, or the like).

Figure 7:
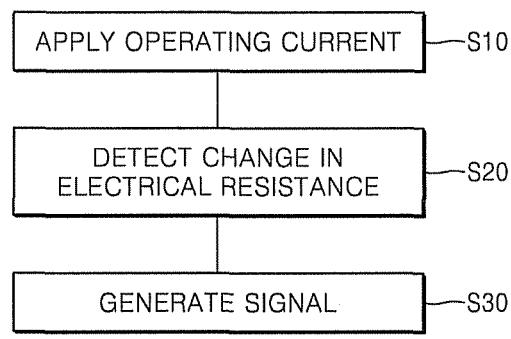
FIG. 7 is a flowchart illustrating a method of operating an oscillator, according to example embodiments.

FIG. 7 is a flowchart illustrating a method of operating an oscillator according to example embodiments.

FIG. 7 will be described in association with FIG. 1.

Referring to FIG. 7, a magnetic moment of at least one of first and second free layers F1 and F2 may be precessed by applying a current to the oscillator (S10). While the at least one of the first and second free layers F1 and F2 is precessed, a change in the electrical resistance of the oscillator may be detected (S20). Due to the change in the electrical resistance of the oscillator, a signal having a given frequency may be generated (S30).

Figure 8:
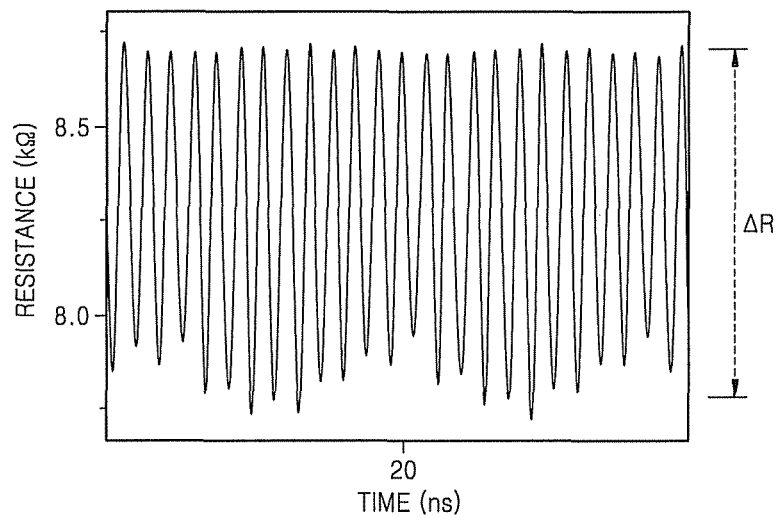
FIG. 8 is a graph showing a change in the resistance of an oscillator according to time when a current is applied to the oscillator according to example embodiments.

FIG. 8 is a graph showing a change in the resistance of an oscillator according to time when a current is applied to the oscillator according to example embodiments.

In FIG. 8, the oscillator has a structure of FIG. 2, and the intensity of an applied current is about 30 MA/cm$^2$.

Referring to FIG. 8, the resistance of the oscillator is repeatedly varied at a given time interval. In this regard, the amount of change in resistance AR is about 0.8 kΩ to about 0.9 kΩ.

Figure 9:
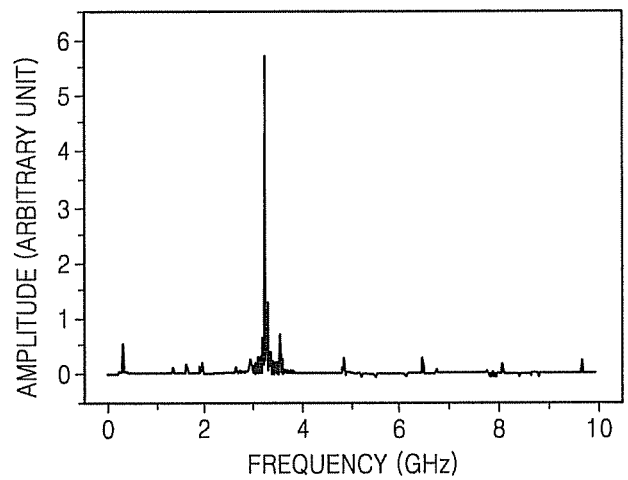
FIG. 9 is a graph transformed from FIG. 8 by fourier transform, showing an oscillation frequency of an oscillator according to example embodiments.

FIG. 9 is a graph transformed from FIG. 8 by Fourier transform, showing an oscillation frequency of the oscillator according to example embodiments.

Referring to FIG. 9, a high-frequency signal of about 3.2 GHz may be generated with the oscillator according to example embodiments. The oscillation frequency of the oscillator may be varied according to the intensity of an applied current and a structure of the oscillator.

Figure 10:
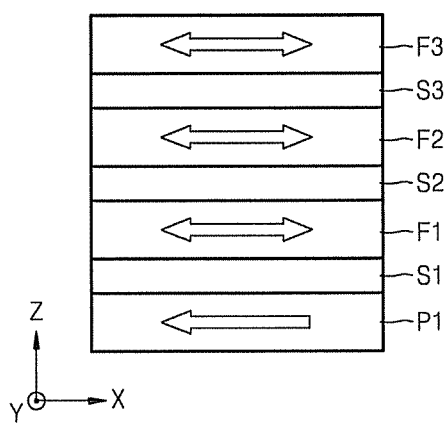
FIGS. 10 and 11 are cross-sectional views of oscillators according to example embodiments.

In FIGS. 1 through 3, the oscillator includes two free layers F1 and F2. According to example embodiments, the oscillator may include three or more free layers. An example thereof is shown in FIG. 10. The structure of FIG. 10 is modified from FIG. 1.

FIG. 10 is a cross-sectional view of an oscillator according to example embodiments.

Referring to FIG. 10, first through third free layers F1, F2, and F3 may be sequentially disposed on a pinned layer P1. A first separation layer S1 may be interposed between the pinned layer P1 and the first free layer F1, and a second separation layer S2 may be interposed between the first free layer F1 and the second free layer F2, and a third separation layer S3 may be interposed between the second free layer F2 and the third free layer F3. The structure of FIG. 10 may be a structure in which the third separation layer S3 and the third free layer F3 are additionally stacked on the second free layer F2 of FIG. 1. Alternatively, an additional separation layer and an additional free layer may be alternately stacked on the third free layer F3 of FIG. 10. Additional separation layers and free layers may be alternately stacked as needed. In the structures of FIGS. 2 and 3, three or more additional free layers may be used.

Figure 11:
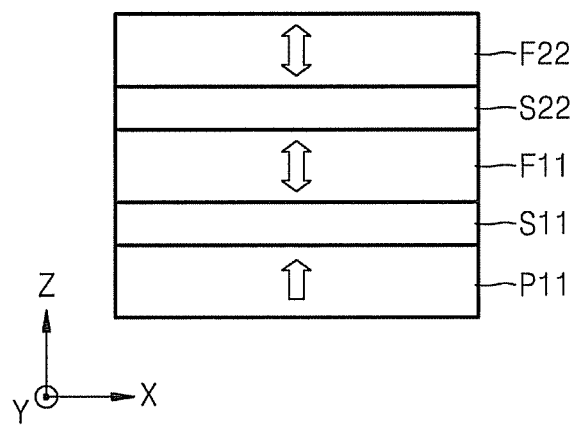

In example embodiments described above, the free layers F1, F2, and F3 and the pinned layers P1 and P2 have in-plane magnetic anisotropy. However, example embodiments are not limited thereto. In detail, the free layers F1, F2 and F3 and the pinned layers P1 and P2 may have perpendicular magnetic anisotropy. For example, as illustrated in FIG. 11, a pinned layer P11 and first and second free layers F11 and F22 may have perpendicular magnetic anisotropy. In FIG. 11, reference numerals S11 and S22 denote a first separation layer and a second separation layer, respectively. When a material having perpendicular magnetic anisotropy is used, the orbit and direction of precession may be varied.

Additionally, when the principle of the oscillator according to the above-described example embodiments is reversely applied, a radio frequency (RF) detector that converts a high-frequency signal into a direct current (DC) signal may be realized. In other words, the structures of FIGS. 1 through 3 and FIG. 10 may be applied to the RF detector. It is generally known to one of skilled person in the communication industries that the principle of the oscillator is reversely applicable for a RF detector, and thus, detailed descriptions thereof are omitted for the sake of brevity.

While the present invention has been particularly shown and described with reference to example embodiments thereof, it will be understood by those of ordinary skill in the art that various changes in form and details may be made therein without departing from the spirit and scope of the present invention as defined by the following claims. The structures of the oscillators shown in FIGS. 1 through 3 and FIG. 10 may be modified in various ways, and a method of operating each of the oscillators shown in FIGS. 1 through 3 and FIG. 10 may be varied in various ways too. For example, other material layers may be additionally disposed between layers constituting an oscillator or on at least one of upper and lower surfaces of the oscillator. Accordingly, it should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. An oscillator, comprising:
a first pinned layer having a fixed magnetization direction;
a first free layer over the first pinned layer; and
a second free layer over the first free layer,
wherein the oscillator is configured to generate a signal using precession of a magnetic moment of at least one of the first and second free layers, and wherein the first pinned layer is configured to apply a first spin torque to the first free layer, the second free layer is configured to apply one of a second spin torque and a first stray field to the first free layer, and the second spin torque and the first stray field have a direction opposite to that of the first spin torque.

2. The oscillator of claim 1, wherein the first pinned layer and the first and second free layers have in-plane magnetic anisotropy.

3. The oscillator of claim 1, wherein the first pinned layer and the first and second free layers have perpendicular magnetic anisotropy.

4. The oscillator of claim 1, further comprising:
a first separation layer between the first pinned layer and the first free layer; and
a second separation layer between the first free layer and the second free layer, wherein the first and second separation layers are one of an insulating layer and a conductive layer.

5. The oscillator of claim 4, further comprising:
at least one additional free layer above the second free layer; and
at least one additional separation layer between the free layers.

6. The oscillator of claim 1, further comprising:
a synthetic antiferromagnet (SAF) structure, wherein the synthetic antiferromagnet (SAF) structure includes the first pinned layer.

7. The oscillator of claim 6, wherein the SAF structure further includes:
a second pinned layer, wherein the first pinned layer is between the second pinned layer and the first free layer; and
a spacer between the first pinned layer and the second pinned layer.

8. The oscillator of claim 1, further comprising:
an antiferromagnetic layer on a surface of the first pinned layer.

9. The oscillator of claim 8, wherein the first pinned layer is between the antiferromagnetic layer and the first free layer.

10. The oscillator of claim 1, wherein the oscillator is a magnetic field-free oscillator.

11. A method of operating an oscillator, comprising:
applying a current to the oscillator so that a magnetic moment of a first free layer is precessed by,
applying a first spin torque to the first free layer, wherein the first spin torque is applied by a first pinned layer, and
providing one of a second spin torque and a first stray field to the first free layer from a second free layer, wherein the second spin torque and the first stray field have a direction opposite to that of the first spin torque; and
detecting a change in a resistance of the oscillator when the magnetic moment of the first free layer is precessed.

12. The method of claim 11, further comprising
applying the current to the oscillator so that electrons flow from the first pinned layer to the first and second free layers.

13. The method of claim 12, wherein the first pinned layer and the first and second free layers have in-plane magnetic anisotropy.

14. The method of claim 12, wherein the first pinned layer and the first and second free layers have perpendicular magnetic anisotropy.

15. The method of claim 12, wherein
a first separation layer is between the first pinned layer and the first free layer,
a second separation layer is between the first free layer and the second free layer, and
the first and second separation layers are one of an insulating layer and a conductive layer.

16. The method of claim 15, wherein at least one additional separation layer and at least one additional free layer are alternately disposed on the second free layer.

17. The method of claim 12, further comprising:
a synthetic antiferromagnet (SAF) structure, wherein the SAF structure includes the first pinned layer.

18. The method of claim 12, wherein an antiferromagnetic layer is on a lower surface of the first pinned layer.

19. The method of claim 11, further comprising:
inducing precession of a magnetic moment of the second free layer.

20. An oscillator, comprising:
a first pinned layer having a fixed magnetization direction;
a first free layer over the first pinned layer;
a second free layer over the first free layer; and
a first separation layer between the first free layer and the second free layer, wherein the first separation layer insulates the first free layer from the second free layer,
wherein the oscillator is configured to generate a signal using precession of a magnetic moment of at least one of the first and second free layers, and the oscillator is a magnetic field-free oscillator.

21. The oscillator of claim 20, further comprising:
a second separation layer between the first pinned layer and the first free layer.

22. An oscillator, comprising:
a first pinned layer having a fixed magnetization direction;
a first free layer over the first pinned layer, the first free layer having a magnetization easy axis parallel to an in-plane direction of the first free layer;
a second free layer over the first free layer, the second free layer having a magnetization easy axis parallel to an in-plane direction of the second free layer; and
wherein the oscillator is configured to generate a signal using precession of a magnetic moment of at least one of the first and second free layers, and the oscillator is a magnetic field-free oscillator.

* * * * *